United States Patent
Shin et al.

(10) Patent No.: US 11,004,928 B2
(45) Date of Patent: *May 11, 2021

(54) DISPLAY DEVICE

(71) Applicant: Samsung Display Co., Ltd., Yongin-si (KR)

(72) Inventors: Juncheol Shin, Yongin-si (KR);
Jeongho Lee, Yongin-si (KR);
Hokyoon Kwon, Yongin-si (KR);
Yanghee Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/745,638

(22) Filed: Jan. 17, 2020

(65) Prior Publication Data

US 2020/0152727 A1 May 14, 2020

Related U.S. Application Data

(63) Continuation of application No. 16/193,013, filed on Nov. 16, 2018, now Pat. No. 10,553,669, which is a
(Continued)

(30) Foreign Application Priority Data

Nov. 23, 2016 (KR) .......................... 10-2016-0156592

(51) Int. Cl.
*H01L 27/32* (2006.01)
*H01L 51/52* (2006.01)

(52) U.S. Cl.
CPC ...... *H01L 27/3279* (2013.01); *H01L 27/3258* (2013.01); *H01L 51/5253* (2013.01)

(58) Field of Classification Search
CPC combination set(s) only.
See application file for complete search history.

(56) References Cited

U.S. PATENT DOCUMENTS 9,287,329 B1 3/2016 Lee et al.
2009/0267225 A1* 10/2009 Eguchi .................. H01L 21/568
257/729
(Continued)

FOREIGN PATENT DOCUMENTS

KR 10-2009-0064320 6/2009
KR 10-2016-0100135 8/2016
KR 10-2017-0115149 10/2017

*Primary Examiner* — Mamadou L Diallo
(74) *Attorney, Agent, or Firm* — Kile Park Reed & Houtteman PLLC

(57) ABSTRACT

A display device includes a non-display area adjacent a display area, a thin film transistor, a display element, a thin film encapsulation layer, an organic insulating layer, a power voltage line, and a protective layer. The thin film transistor is on the display area and is connected to the display element. The thin film encapsulation layer covers the display element. The organic insulating layer is between the thin film transistor and display element and extends to the non-display area. The organic insulating layer includes a central portion corresponding to the display area, an outer portion surrounding the central portion, and a division region dividing the central portion and the outer portion and surrounding the display area. The power voltage line is in the non-display area and includes a portion corresponding to the division region. The protective layer covers an upper surface of the power voltage line in the division region.

22 Claims, 8 Drawing Sheets

Related U.S. Application Data continuation of application No. 15/811,838, filed on Nov. 14, 2017, now Pat. No. 10,134,829.

(56) References Cited

U.S. PATENT DOCUMENTS

| | | | |
|---|---|---|---|
| 2016/0126345 A1 | 5/2016 | Tamaki et al. | |
| 2016/0240598 A1 | 8/2016 | You | |
| 2016/0240682 A1* | 8/2016 | Shimomura | H01L 29/78696 |
| 2016/0260836 A1* | 9/2016 | Okazaki | H01L 29/4908 |
| 2016/0365398 A1 | 12/2016 | Kim et al. | |
| 2017/0155088 A1 | 6/2017 | Kim et al. | |
| 2017/0287995 A1 | 10/2017 | Kim et al. | |
| 2017/0373128 A1 | 12/2017 | Lee et al. | |
| 2018/0033849 A1 | 2/2018 | Noh et al. | |
| 2018/0130859 A1* | 5/2018 | Nishimura | H01L 51/5203 |

* cited by examiner

DISPLAY DEVICE

CROSS-REFERENCE TO RELATED APPLICATION

This is a continuation application based on currently pending U.S. patent application Ser. No. 16/193,013, filed on Nov. 16, 2018, the disclosure of which is incorporated herein by reference in its entirety. U.S. patent application Ser. No. 16/193,013 is a continuation application of U.S. patent application Ser. No. 15/811,838, filed Nov. 14, 2017, now U.S. Pat. No. 10,134,829, issued Nov. 20, 2018, the disclosure of which is incorporated herein by reference in its entirety. U.S. Pat. No. 10,134,829 claims priority benefit of Korean Patent Application No. 10-2016-0156592, filed on Nov. 23, 2016 in the Korean Intellectual Property Office, the disclosure of which is incorporated herein by reference in its entirety for all purposes.

BACKGROUND

1. Field

One or more embodiments described herein relate to a display device.

2. Description of the Related Art

A variety of flat-panel displays have been developed. These displays tend to be lightweight and have a slim profile with low power consumption. In order to enhance aesthetics and the viewing experience, attempts have been made to reduce the size of non-display areas of these displays.

SUMMARY

In accordance with one or more embodiments, a display device includes a substrate including a non-display area adjacent to a display area; a thin film transistor on the display area and a display element electrically connected to the thin film transistor; a thin film encapsulation layer covering the display element; an organic insulating layer between the thin film transistor and the display element and extending to the non-display area, the organic insulating layer including a central portion corresponding to the display area, an outer portion surrounding the central portion, and a division region dividing the central portion and the outer portion and surrounding the display area; a power voltage line in the non-display area and including a portion corresponding to the division region; and a protective layer covering an upper surface of the power voltage line in the division region. The protective layer may include an inorganic insulating material.

The display device may include a driving voltage line in the display area and electrically connected to the thin film transistor, wherein the display element may includes: a pixel electrode, an opposite electrode facing the pixel electrode, and an intermediate layer between the pixel electrode and the opposite electrode, and wherein the organic insulating layer is between the driving voltage line and the pixel electrode. The power voltage line may include a first conductive layer; and a second conductive layer on the first conductive layer and contacting the first conductive layer. An end portion of the second conductive layer for the division region may cover a lateral surface of a portion of the first conductive layer corresponding to the division region.

The display device may include a lower driving voltage line and an upper driving voltage line in the display area and electrically connected to the thin film transistor; and an insulating layer between the lower driving voltage line and the upper driving voltage line, the insulating layer including a contact hole to connect the lower driving voltage line and the upper driving voltage line. The insulating layer may include an organic insulating material.

The first conductive layer may include a same material as the lower driving voltage line, and the second conductive layer may include a same material as the upper driving voltage line. At least one of the first conductive layer or the second conductive layer may be a multi-layer, and the multi-layer may include a first layer including titanium, a second layer including aluminum, and a third layer including titanium.

The thin film encapsulation layer includes at least one inorganic encapsulation layer and at least one organic encapsulation layer, and a portion of the inorganic encapsulation layer corresponding to the division region may be covered with the thin film encapsulation layer. The protective layer may cover a portion of an upper surface of at least one of the central portion or the outer portion of the organic insulating layer.

The power voltage line may be below the organic insulating layer. The central portion and the outer portion of the organic insulating layer may contact an upper surface of the power voltage line.

The display device may include a pad portion corresponding to one edge of the substrate, wherein the power voltage line includes a connection portion extending from one side of the display area to the pad portion and wherein at least a portion of the connection portion crosses the division region. The display device may include a dam inside the division region and surrounding the display area. The dam may be spaced apart from the central region and the outer region of the organic insulating layer.

The display device may include an additional insulating layer including a first insulating portion and a second insulating portion respectively over the central portion and the outer portion, wherein the additional insulating layer including a separation region corresponding to the division region. The display element may include a pixel electrode, an opposite electrode facing the pixel electrode, and an intermediate layer between the pixel electrode and the opposite electrode, and wherein the intermediate layer includes an emission layer.

The display device may include a pixel-defining layer includes an opening exposing the pixel electrode, wherein the additional insulating layer includes a same material as the pixel-defining layer. The power voltage line may include a first power voltage line and a second power voltage line to receive different voltages, the central portion of the organic insulating layer may include an auxiliary division region between a portion of the first power voltage line and a portion of the second power voltage line and may overlap the portion of the first power voltage line and the portion of the second power voltage line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
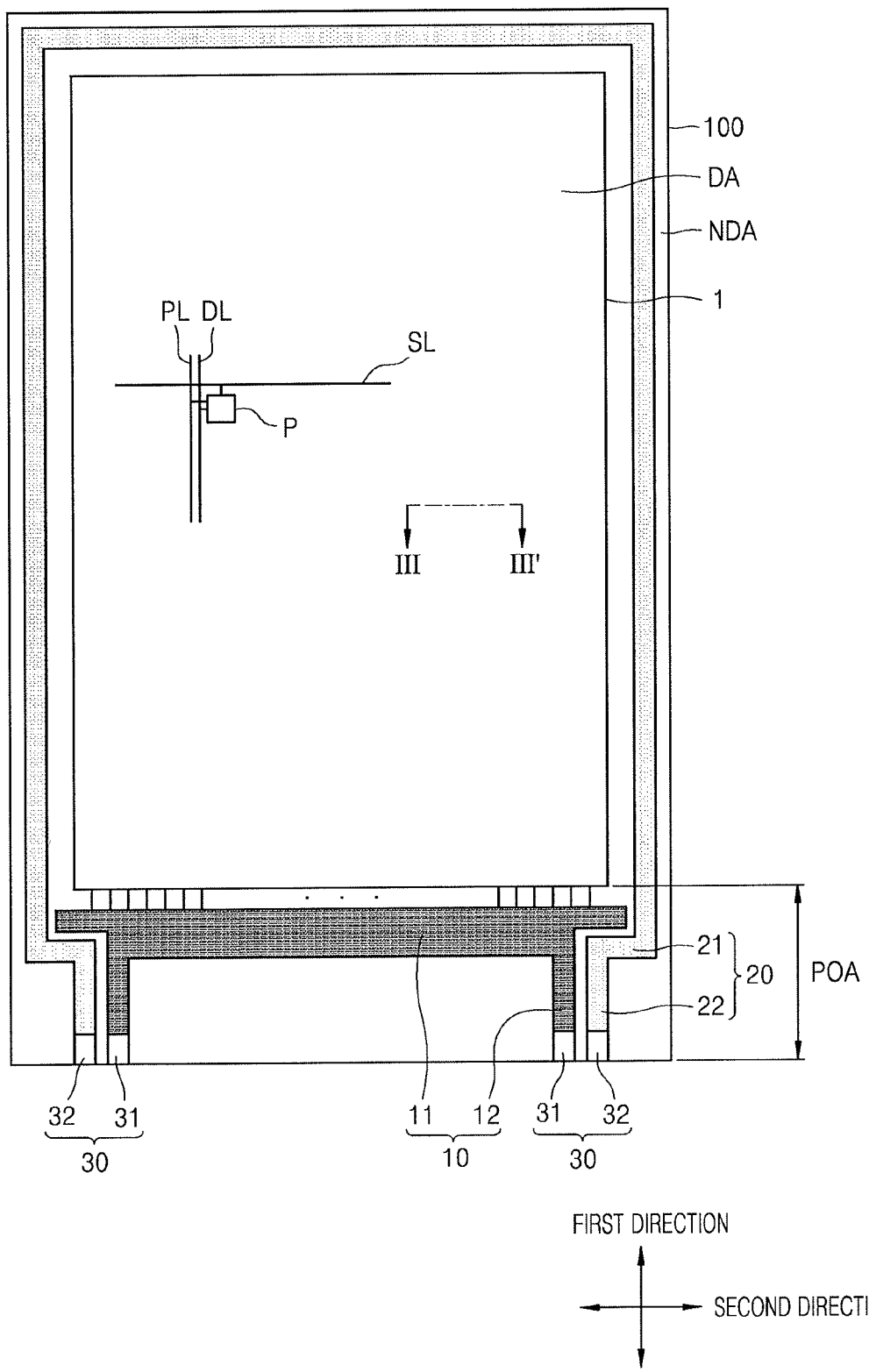
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a display device which includes a display unit 1 over a substrate 100. The display unit 1 includes a plurality of pixels P, each pixel connected to a respective one of a plurality of data lines DL extending in a first direction and a respective one of a plurality of scan lines SL extending in a second direction crossing the first direction. Each pixel P is also connected to a respective one of a plurality of driving voltage lines PL extending in the first direction.

The pixels P emit light of a plurality of colors, e.g., red, green, blue, and/or white light from, for example, organic light-emitting diodes (OLEDs). The display unit 1 provides a predetermined image in a display area DA based on light emitted from the pixels P. Each pixel P may be considered, for example, a sub-pixel emitting one of red, green, blue, or white light as described above.

A non-display area NDA is outside the display area DA. For example, the non-display area NDA may surround the display area DA. The non-display area NDA is a region in which the pixels P are not arranged and does not provide an image. A first power voltage line 10 and a second power voltage line 20, which respectively apply different power voltages, may be arranged in the non-display area NDA.

The first power voltage line 10 may include a first main voltage line 11 and a first connection line 12 corresponding to one side of the display area DA. For example, when the display area DA is rectangular, the first main voltage line 11 may correspond to one side of the display area DA. The first main voltage line 11 may be parallel to one of the sides and have a length equal to or greater than the length of the one of the sides. One side corresponding to the first main voltage line 11 may be adjacent to a pad portion 30.

The first connection line 12 extends from the first main voltage line 11 in a first direction. For example, the first connection line 12 may extend in the first direction in a pull-off area POA. The pull-off area POA may be, for example, a region ranging from the pad portion 30 to one of the sides of the display area DA adjacent to the pad portion 30. The first direction may be, for example, a direction from the display area DA to the pad portion 30. The first connection line 12 may be connected to the pad portion 30, for example, a first pad end 32.

A second power voltage line 20 may include a second main voltage line 21 and a second connection line 22. The second main voltage line 21 may partially surround the display area DA. Opposite ends of the first main voltage line 11 and the second connection line 22 may extend from the second main voltage line 21 to the pad portion 30 in the first direction. For example, when the display area DA is rectangular, the second main voltage line 21 may extend along the opposite ends of the first main voltage line 11 and other or remaining sides of the display area DA other than the side adjacent to the first main voltage line 11. The second connection line 22 extends parallel to the first connection line 12 in the first direction in the pull-off area POA and is connected to the pad portion 30, for example, a second pad end 32.

The pad portion 30 corresponds to one end of the substrate 100, is not covered by an insulating layer, etc., but is exposed, and may be connected to a controller via a flexible printed circuit board (FPCB), etc. A signal or power of the controller is provided to the display device via the pad portion 30.

The first power voltage line 10 provides a first power voltage ELVDD to each pixel P. The second power voltage line 20 provides a second power voltage ELVSS to each pixel P. For example, the first power voltage ELVDD may be provided to each pixel P via the driving voltage line PL connected to the first power voltage line 10. The second power voltage ELVSS is provided to a cathode of an OLED of each pixel P. In this case, the second main voltage line 21 of the second power voltage line 20 may be connected to the cathode of the OLED in the non-display area NDA.

A scan driver provides a scan signal to the scan lines SL and a data driver provides data signals to the data lines DL. The scan driver and the data driver may be in the non-display area NDA.

Figure 2A:
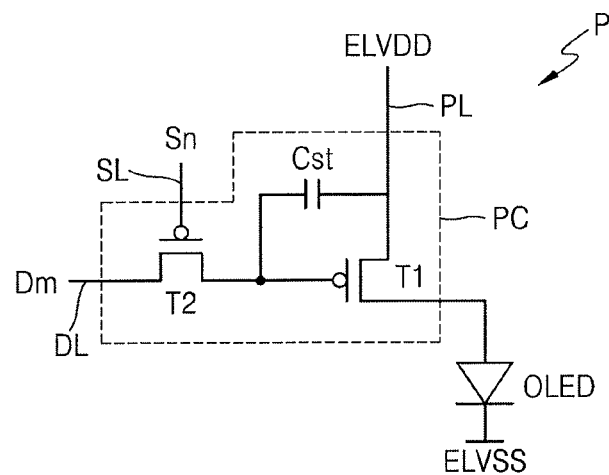
FIGS. 2A and 2B illustrate embodiments of a pixel.
Figure 2B:
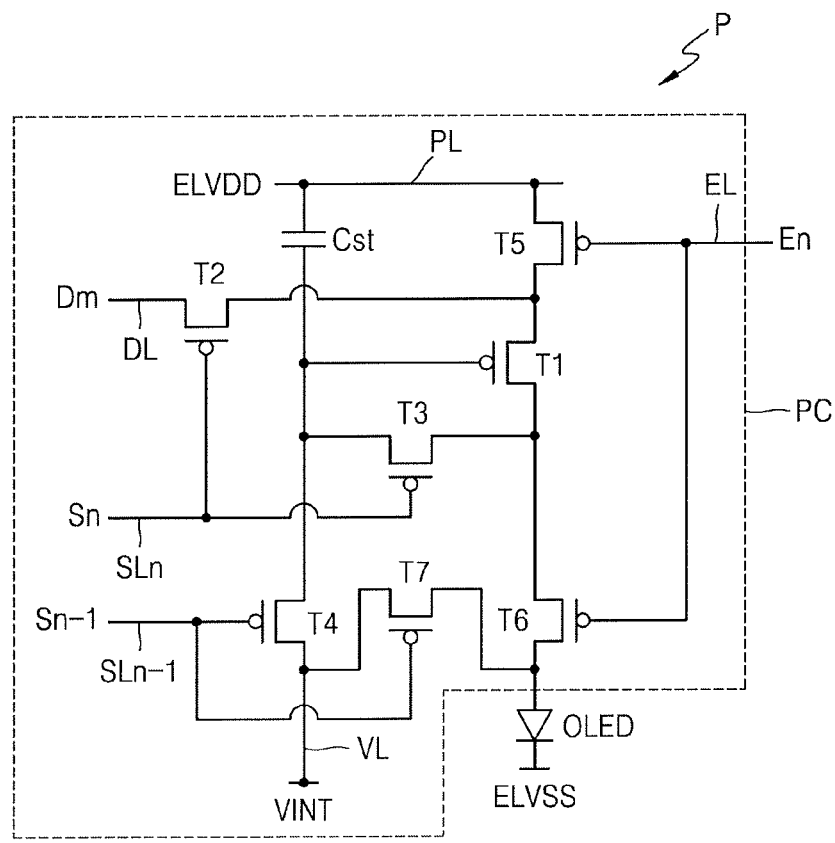

FIGS. 2A and 2B illustrate embodiments of a pixel, which, for example, may be representative of the pixels P in the display device of FIG. 1. Referring to FIG. 2A, each pixel P includes a pixel circuit PC connected to an OLED. The pixel circuit PC is connected to the scan line SL and the data line DL.

The pixel circuit PC includes a driving thin film transistor (TFT) T1, a switching TFT T2, and a storage capacitor Cst. The switching TFT T2 is connected to the scan line SL and the data line DL, and transfers a data signal Dm to the driving TFT T1 via the data line DL based on a scan signal Sn from the scan line SL.

The storage capacitor Cst is connected to the switching TFT T2 and the driving voltage line PL, and stores a voltage corresponding to a difference between a voltage transferred from the switching TFT T2 and the first power voltage ELVDD (or a driving voltage) supplied via the driving voltage line PL.

The driving TFT T1 is connected to the driving voltage line PL and the storage capacitor Cst, and may control a driving current flowing through the OLED from the driving voltage line PL based on the voltage stored in the storage capacitor Cst. The OLED may emit light having predetermined brightness based on the driving current. The pixel circuit PC in FIG. 2A includes two TFTs and one storage capacitor. The pixel circuit may have a different number of TFTs and/or capacitors in another embodiment.

Referring to FIG. 2B, the pixel circuit PC may include the driving and switching TFTs T1 and T2, a compensation TFT T3, a first initialization TFT T4, a first emission control TFT T5, a second emission control TFT T6, and a second initialization TFT T7. Each pixel P in FIG. 2B includes signal lines SLn, SLn−1, EL, and DL, an initialization voltage line VL, and a driving voltage line PL. In one embodiment, at least one of the signal lines SLn, SLn−1, EL, and DL, or the initialization voltage line VL may be shared by adjacent pixels.

A drain electrode of the driving TFT T1 may be electrically connected to an OLED via the second emission control TFT T6. The driving TFT T1 receives a data signal Dm and supplies a driving current to the OLED based on a switching operation of the switching TFT T2.

A gate electrode of the switching TFT T2 is connected to the first scan line SLn, and a source electrode of the switching TFT T2 is connected to the data line DL. A drain electrode of the switching TFT T2 may be connected to a source electrode of the driving TFT T1 and simultaneously connected to the driving voltage line PL via the first emission control TFT T5.

The switching TFT T2 is turned on and performs an operation of transferring a data signal Dm from the data line DL to the source electrode of the driving TFT T1 based on a first scan signal Sn from the first scan line SLn.

A gate electrode of the compensation TFT T3 may be connected to the first scan line SLn. A source electrode of the compensation TFT T3 may be connected to the drain electrode of the driving TFT T1 and simultaneously connected to the pixel electrode of the OLED via the second emission control TFT T6. A drain electrode of the compensation TFT T3 may be connected to one electrode of the storage capacitor Cst, a source electrode of the first initialization TFT T4, and the gate electrode of the driving TFT T1, simultaneously. The compensation TFT T3 is turned on, based on a first scan signal Sn from the first scan line SLn, to diode-connect the driving TFT T1 by connecting the gate electrode and the drain electrode of the driving TFT T1.

A gate electrode of the first initialization TFT T4 may be connected to a second scan line (a previous scan line) SLn−1. A drain electrode of the first initialization TFT T4 may be connected to the initialization voltage line VL. A source electrode of the first initialization TFT T4 may be connected to one of the electrodes of the storage capacitor Cst, the drain electrode of the compensation TFT T3, and the gate electrode of the driving TFT T1, simultaneously. The first initialization TFT T4 may be turned on, based on a second scan signal Sn−1 from the second scan line SLn−1, to perform an operation of initializing the voltage of the gate electrode of the driving TFT T1 based on an initialization voltage VINT supplied to the gate electrode of the driving TFT T1.

A gate electrode of the first emission control TFT T5 may be connected to an emission control line EL. A source electrode of the first emission control TFT T5 may be connected to the driving voltage line PL. A drain electrode of the first emission control TFT T5 is connected to the source electrode of the driving TFT T1 and the drain electrode of the switching TFT T2, simultaneously.

A gate electrode of the second emission control TFT T6 may be connected to an emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the OLED. The first emission control TFT T5 and the second emission control TFT T6 are simultaneously turned on based on an emission control signal En from the emission control line EL. When transistors TFT T5 and TFT T6 are turned on, the first power voltage ELVDD is transferred to the OLED and driving current flows through the OLED.

A gate electrode of the second initialization TFT T7 may be connected to the second scan line SLn−1. A source electrode of the second initialization TFT T7 may be connected to the pixel electrode of the OLED. A drain electrode of the second initialization TFT T7 may be connected to the initialization voltage line VL. The second initialization TFT T7 may be turned on to initialize the pixel electrode of the OLED based on a second scan signal Sn−1 from the second scan line SLn−1.

The first initialization TFT T4 and the second initialization TFT T7 are connected to the second scan line SLn−1 in FIG. 2B. In one embodiment, the first initialization TFT T4 may be connected to the second scan line SLn−1 and driven based on a second scan signal Sn−1. Also, the second initialization TFT T7 may be connected to a separate signal line (e.g. a next scan line) and driven based on a signal from a corresponding scan line.

Another electrode of the storage capacitor Cst may be connected to the driving voltage line PL. One electrode of the storage capacitor Cst may be connected to the gate electrode of the driving TFT T1, the drain electrode of the compensation TFT T3, and the source electrode of the first initialization TFT T4, simultaneously.

The other electrode (e.g. cathode) of the OLED receives the second power voltage ELVSS (or a common power voltage). The OLED emits light based on the driving current from the driving TFT T1. The circuit design and/or number of TFTs and capacitors of the pixel circuit PC may be different in another embodiment.

Figure 3:
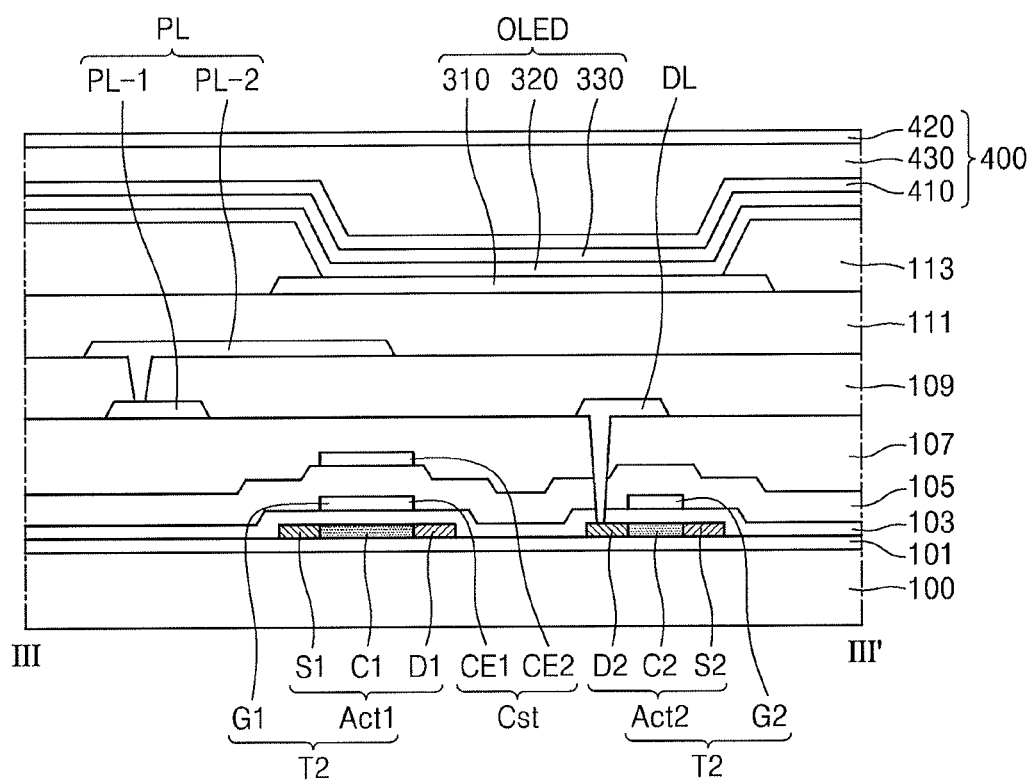
FIG. 3 illustrates a view taken along section line in FIG. 1.

FIG. 3 illustrates a cross-sectional view of an embodiment of a pixel of the display device taken along line in FIG. 1. FIG. 3 illustrates the first and second TFTs T1 and T2 and the storage capacitor Cst of the pixel circuit PC of each pixel described with reference to FIGS. 2A and 2B. For convenience, description is made according to a stacked order in FIG. 3.

Referring to FIG. 3, a buffer layer 101 is on the substrate 100, and the driving and switching TFTs T1 and T2 and the storage capacitor Cst are over the buffer layer 101. The substrate 100 may include, for example, a glass material or a plastic material including polyethylene terephthalate (PET), polyethylene napthalate (PEN), or polyimide (PI). When the substrate 100 includes a plastic material, the substrate 100 may have greater flexibility than when the substrate 100 includes a glass material. The buffer layer 101 including SiOx and/or SiNx may be on the substrate 100 to prevent penetration of impurities.

The driving TFT T1 includes a driving semiconductor layer Act1 and the driving gate electrode G1. The switching TFT T2 includes a switching semiconductor layer Act2 and the switching gate electrode G2. A first gate insulating layer 103 is between the driving semiconductor layer Act1 and the driving gate electrode G1 and between the switching semiconductor layer Act2 and the switching gate electrode G2. The first gate insulating layer 103 may include an inorganic insulating material such as SiOx, SiNx, and SiON.

The driving semiconductor layer Act1 and the switching semiconductor layer Act2 may include polycrystalline silicon. The driving semiconductor layer Act1 includes a driving channel region C1. A driving source region S1 and a driving drain region D1 are at opposite sides of the driving channel region C1. The driving channel region C1 overlaps the driving gate electrode G1 and is not doped with impurities. The driving source region S1 and the driving drain region D1 are doped with impurities. The switching semiconductor layer Act2 may include a switching channel region C2. A switching source region S2 and a switching drain region D2 are at opposite sides of the switching channel region C2. The switching channel region C2 overlaps the switching gate electrode G2 and is not doped with impurities. The switching source region S2 and the switching drain region D2 are doped with impurities.

The driving and switching gate electrodes G1 and G2 may include, for example, Mo, Al, Cu, and Ti and may have a single layer or a multi-layer. For example, driving and switching gate electrodes G1 and G2 may include a single layer including Mo.

The source and drain regions of the TFTs may correspond to a source electrode and a drain electrode of the TFT, respectively. Thus, the terms source region and drain region may be used instead of source electrode and drain electrode.

In an embodiment, the storage capacitor Cst may overlap the driving TFT T1. In this case, areas of the storage capacitor Cst and the driving TFT may be increased and a high-quality image may be provided. For example, the driving gate electrode G1 may serve as a first storage capacitor plate CE1 of the storage capacitor Cst. A second storage capacitor plate CE2 may overlap the first storage capacitor plate CE1, with a second gate insulating layer 105 therebetween. The second gate insulating layer 105 may include an inorganic insulating layer such as SiOx, SiNx, or SiON.

The driving and switching TFTs T1 and T2 and the storage capacitor Cst may be covered by an interlayer insulating layer 107. The interlayer insulating layer 107 may be an inorganic layer including SiON, SiOx and/or SiNx. The data line DL may be on the interlayer insulating layer 107. The data line DL is connected to the switching semiconductor layer Act2 of the switching TFT T2 via a contact hole passing through the interlayer insulating layer 107.

The driving voltage line PL is on the interlayer insulating layer 107 and may include a lower driving voltage line PL-1 and an upper driving voltage line PL-2. To provide a high-quality image or implement a large-sized display device, a voltage drop resulting from resistance of the driving voltage line PL may be offset. According to an embodiment, since the driving voltage line PL includes the electrically connected lower driving voltage line PL-1 and upper driving voltage line PL-2, a voltage drop of the driving voltage line PL may be prevented.

The lower driving voltage line PL-1 may include, for example, a same material as the data line DL. For example, the lower driving voltage line PL-1 may include Mo, Al, Cu, Ti, etc. and may be a multi-layer or a single layer. In an embodiment, the lower driving voltage line PL-1 may include a multi-layer of Ti/Al/Ti.

The lower driving voltage line PL-1 and the upper driving voltage line PL-2 are connected to each other via a contact hole in a first insulating layer 109 therebetween. The driving voltage line PL may be covered by a second insulating layer 111. The upper driving voltage line PL-2 may include Mo, Al, Cu, Ti, etc. and may be a multi-layer or a single layer. In an embodiment, the upper driving voltage line PL-2 may include a multi-layer of Ti/Al/Ti.

The second insulating layer 111 is a planarization insulating layer including an organic material. The organic material may include a general-purpose polymer such as an imide-based polymer, polymethylmethacrylate (PMMA) or polystyrene (PS), or polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. The first insulating layer 109 may include an organic material, examples of which are described above. In one embodiment, the first insulating layer 109 may include an inorganic material such as SiON, SiOx and/or SiNx.

The OLED may be on the second insulating layer 111 and may include a pixel electrode 310, an opposite electrode 330, and an intermediate layer 320 therebetween, the intermediate layer 320 including an emission layer.

A pixel-defining layer 113 may be on the pixel electrode 310 and may define a pixel by including an opening exposing the pixel electrode 310. The pixel-defining layer 113 may prevent an arc, etc., from occurring between the pixel electrode 310 and the opposite electrode 330, by increasing the distance between the edge of the pixel electrode 310 and the opposite electrode 330. The pixel-defining layer 113 may include, for example, an organic material such as PI or hexamethyldisiloxane (HMDSO).

The intermediate layer 320 may include a low molecular or polymer material. When the intermediate layer 320 includes a low molecular material, the intermediate layer 320 may have a structure in which a hole injection layer (HIL), a hole transport layer (HTL), an emission layer (EML), an electron transport layer (ETL), an electron injection layer (EIL), etc. are stacked in a single or a composite configuration The intermediate layer 320 may include one or more organic materials, e.g., copper phthalocyanine (CuPc), N,N'-Di(naphthalene-1-yl)-N,N'-diphenyl-benzidine (NPB), and tris-8-hydroxyquinoline aluminum (Alq3). These layers may be formed, for example, by vacuum evaporation.

When the intermediate layer 320 includes a polymer material, the intermediate layer 320 may have a structure including an HTL and an EML. The HTL may include a PEDOT. The EML may include a polymer material such as polyphenylene vinylene (PPV)-based material and a polyfluorene-based material. The structure of the intermediate layer 320 may have a different structure in another embodiment. For example, the intermediate layer 320 may include a layer having one body over a plurality of pixel electrodes 310 or may include a layer patterned to respectively correspond to the pixel electrodes 310.

The opposite electrode 330 may be in the display area DA and may cover the display area DA. For example, the opposite electrode 330 may have one body over a plurality of OLEDs and correspond to the pixel electrodes 310.

The OLED may be easily damaged by external moisture or oxygen. A thin film encapsulation layer 400 may cover the OLED as protection. The thin film encapsulation layer 400 may cover the display area DA and extend to an outside of the display area DA. The thin film encapsulation layer 400 includes at least one organic encapsulation layer and at least one inorganic encapsulation layer. For example, the thin film encapsulation layer 400 may include a first inorganic encapsulation layer 410, an organic encapsulation layer 430, and a second inorganic encapsulation layer 420.

The first inorganic encapsulation layer 410 may cover the opposite electrode 330 and include SiOx, SiNx, and/or SiON. Other layers such as a capping layer may be between the first inorganic encapsulation layer 410 and the opposite electrode 330. Since the first inorganic encapsulation layer 410 is along a structure thereunder, an upper surface of the first inorganic encapsulation layer 410 is not planarized.

The organic encapsulation layer 430 covers the first inorganic encapsulation layer 410. Unlike the first inorganic encapsulation layer 410, an upper surface of the organic encapsulation layer 430 corresponding to the display area DA may be approximately planarized. The organic encapsulation layer 430 may include at least one of polyethylene terephthalate (PET), polyethylene naphthalate (PEN), polycarbonate (PC), PI, polyethylene sulfonate, polyoxymethylene (POM), polyarylate, or HMDSO. The second inorganic encapsulation layer 420 may cover the organic encapsulation layer 430 and include SiOx, SiNx, and/or SiON.

Even when a crack occurs inside the encapsulation layer 400, the thin film encapsulation layer 400 may prevent the crack from being connected between the first inorganic encapsulation layer 410 and the organic encapsulation layer 430, or between the organic encapsulation layer 430 and the second inorganic encapsulation layer 420 via the above-described multi-layered structure. Therefore, the thin film encapsulation layer 400 may prevent, reduce, or minimize formation of a path through which external moisture or oxygen penetrates into the display area DA. A polarization plate may be over the encapsulation layer 400 using a light transmissive adhesive. The polarization plate is a structure for reducing external light reflection. A layer including a black matrix and a color filter may be used for the polarization plate.

Figure 4:
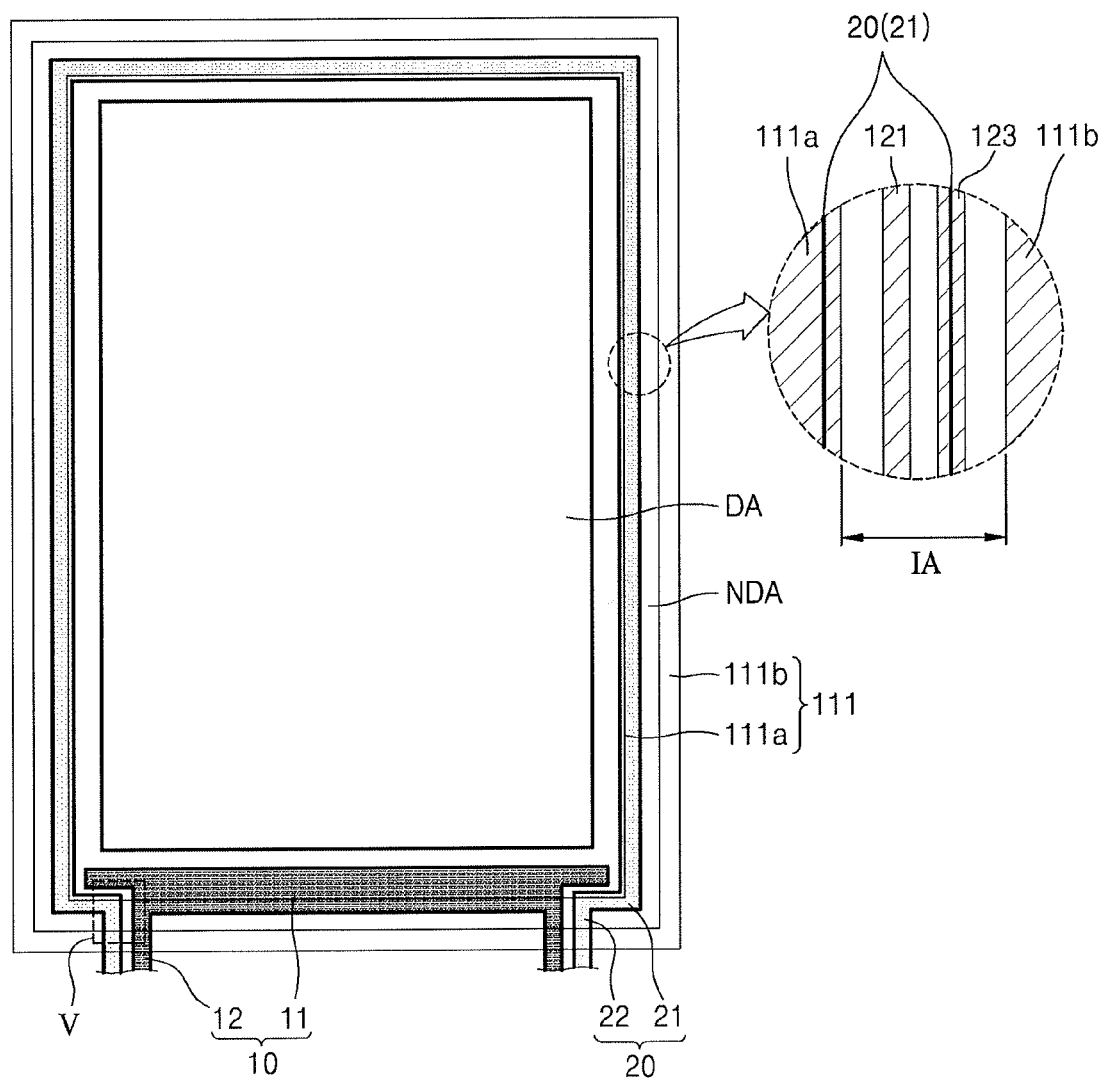
FIG. 4 illustrates an embodiment of a power line and second insulating layer.

FIG. 4 illustrates an embodiment of a power voltage line and a second insulating layer. Referring to FIG. 4, as described with reference to FIGS. 3A and 3B, the second insulating layer 111, which is the organic insulating layer, is in the display area DA and extends to the non-display area NDA.

The second insulating layer 111 may include a division region IA corresponding to the non-display area NDA. The division region IA is a region in which the second insulating layer has been removed and surrounds the display area DA. The division region IA may prevent external moisture from penetrating into the display area DA along the second insulating layer 111 including the organic material. The second insulating layer 111 may be divided into a central portion 111a and an outer portion 111b by the division region IA.

The central portion 111a corresponds to the display area DA and may have a greater area than that of the display area DA. In at least one embodiment, the term "corresponding" may be understood to mean "overlapping." The outer portion 111b surrounds the central portion 111a in the display area DA and may surround the display area DA. At least portions of the first power voltage line 10 and the second power voltage line 20 may overlap the division region IA.

One or more dams 121 and 123 may be in the division region IA. FIG. 4 illustrates a structure in which two dams 121 and 123 are arranged. The dams 121 and 123 may prevent an organic material from flowing in an edge direction of the substrate 100 while the organic encapsulation layer 430 (e.g., see FIGS. 3A and 3B) is formed. Thus, an edge tail of organic encapsulation layer 430 may not be formed.

Widths of the dams 121 and 123 may be less than the width of a power voltage line, for example, the second power voltage line 20. In an embodiment, the width of the dam 121 may be less than the width of a power voltage line, for example, the second power voltage line 20 and may be over the second power voltage line 20. In another embodiment, the dam 123 may overlap one edge of a power voltage line, for example, the second main voltage line 21 of the second power voltage line 20. In at least one embodiment, the power voltage line may be understood to denote at least one of the first power voltage line 10 or the second power voltage line 20.

Figure 5:
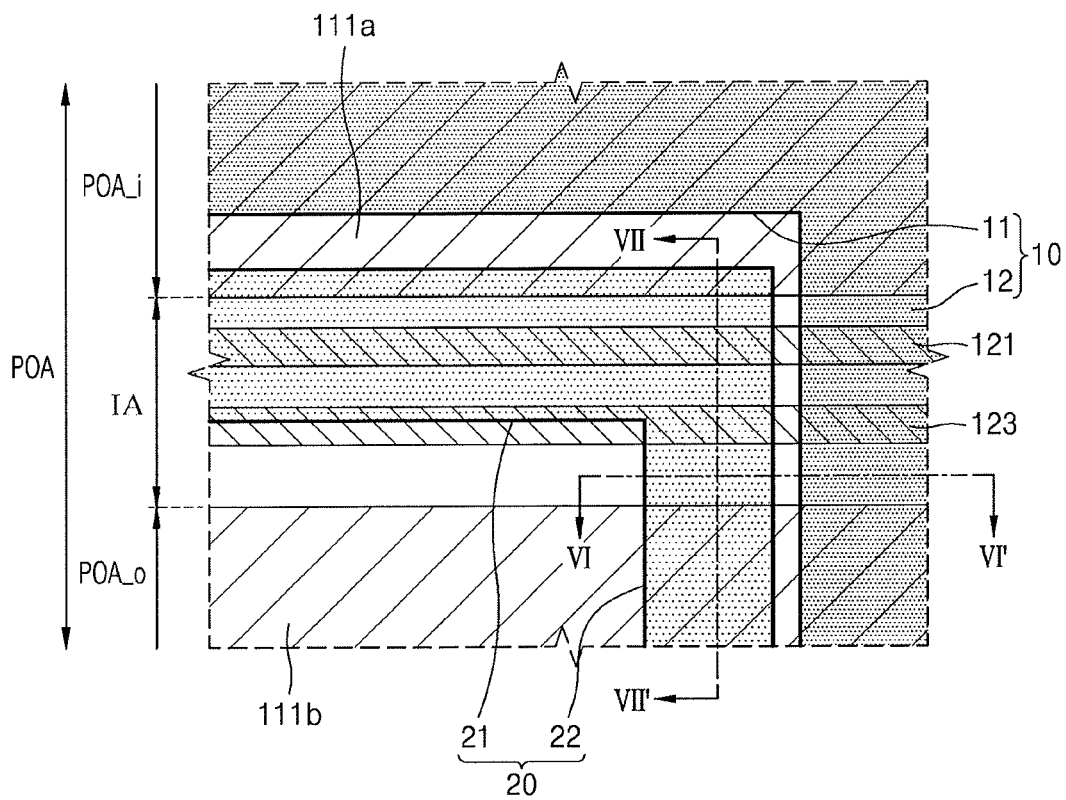
FIG. 5 illustrates an embodiment of portion V in FIG. 4 including a pull-off area.
Figure 6:
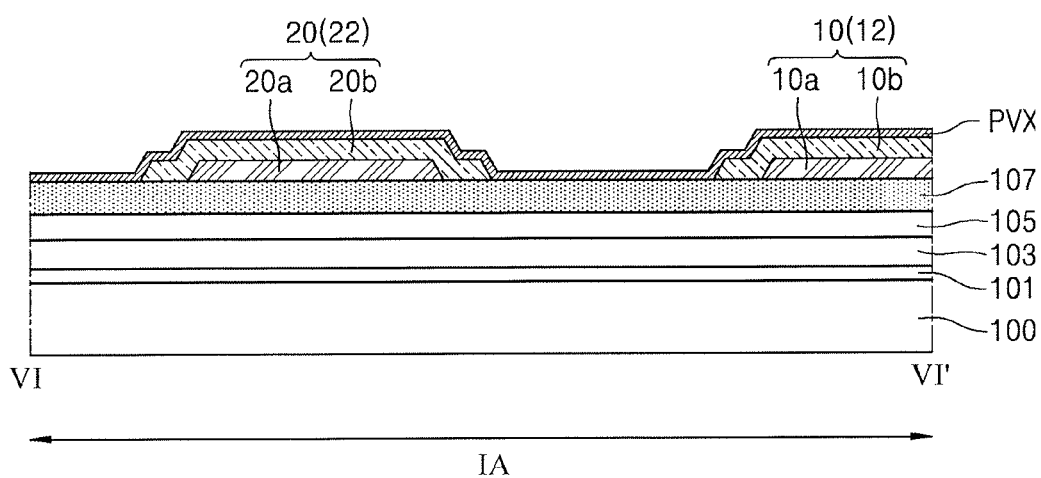
FIG. 6 illustrates a view taken along section line VI-VI' in FIG. 5.
Figure 7:
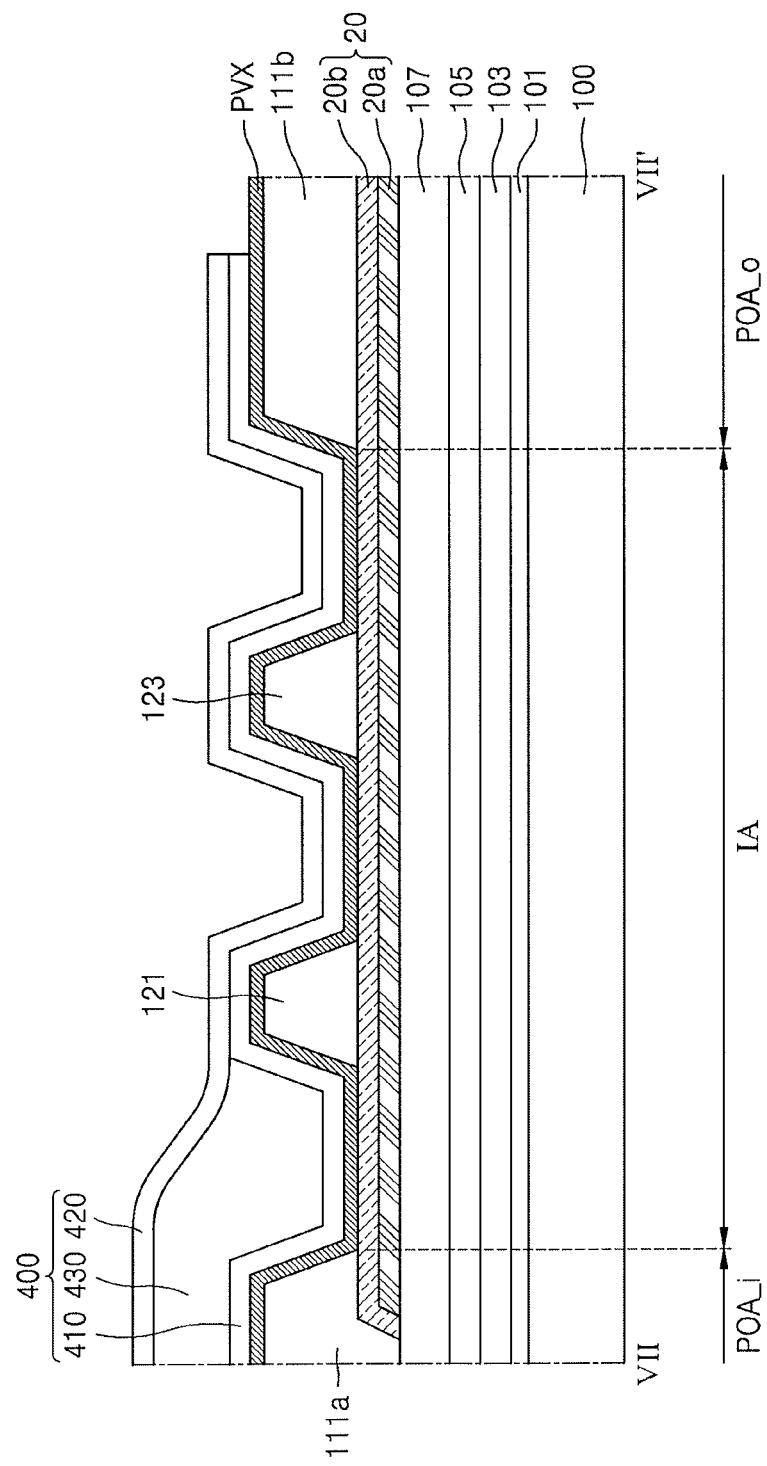
FIG. 7 illustrates a view taken along section line VII-VII in FIG. 5.

FIG. 5 illustrates an enlarged plan view of a portion V of the display device of FIG. 4 and corresponds to a portion of a pull-off area POA of FIG. 1 according to an embodiment. Also, FIG. 6 is a cross-sectional view of the insert portion taken along a line VI-VI' in FIG. 5 according to an embodiment. FIG. 7 is a cross-sectional view of the insert portion taken along a line VII-VII' of FIG. 5 according to an embodiment.

More specifically, FIG. 5 illustrates a portion of the pull-off area POA corresponding to an upper portion of the division region IA, that is, the central portion 111a as an inner pull-off area POA_i. FIG. 5 also illustrate a portion of the pull-off area POA corresponding to a lower portion of the division region IA, that is, the outer portion 111b as an outer pull-off area POA_o.

Referring to FIG. 5, the central portion 111a and the outer portion 111b of the second insulating layer 111 are spaced apart from each other by the division region IA. A portion of the power voltage line may correspond to the central portion 111a. Another portion of the power voltage line may correspond to the division region IA. Another portion of the power voltage line may correspond to the outer portion 111b.

In an embodiment, the first main voltage line 11 of the first power voltage line 10 may extend in a second direction to correspond to the central portion 111a. The first connection line 12 may correspond to the division region IA and the outer portion 111b. A portion of the second main voltage line 21 of the second power voltage line 20 may correspond to the central portion 111a. Remaining ones of the second main voltage line 21 and the second connection line 22 may correspond to the division region IA and the outer portion 111b.

Referring to FIGS. 6 and 7, the power voltage line may have a multi-layered structure including a first conductive layer and a second conductive layer. For example, the first power voltage line 10 may have a two-layered structure including a first conductive layer 10a and a second conductive layer 10b. The second power voltage line 20 may have a two-layered structure including a first conductive layer 20a and a second conductive layer 20b.

The first conductive layers 10a and 20a of the first and second power voltage lines 10 and 20, respectively, may include the same material as the lower driving voltage line PL-1 and the data line DL described with reference to FIGS. 3A and 3B. The second conductive layers 10b and 20b of the first and second power voltage lines 10 and 20, respectively, may include the same material as the upper driving voltage line PL-2 described with reference to FIGS. 3A and 3B. In an embodiment, the first conductive layers 10a and 20a and the second conductive layers 10b and 20b may include the same material. For example, the first and second conductive layers 10a, 20a, 10b, and 20b may include Ti/Al/Ti.

The second conductive layers 10b and 20b may respectively and entirely cover the first conductive layers 10a and 20a. The second conductive layers 10b and 20b may respectively and directly contact the first conductive layers 10a and 20a and cover at least a portion of the first conductive layers 10a and 20a in the division region IA as in FIG. 6. For example, ends of the second conductive layers 10b and 20b corresponding to the division region IA may cover lateral surfaces of ends of the first conductive layers 10a and 20a corresponding to the division region IA, extend further than the first conductive layers 10a and 20a, and directly contact layers (e.g. an interlayer insulating layer) below the first conductive layers 10a and 20a.

The second conductive layers 10b and 20b cover ends of the first conductive layers 10a and 20a in the division region IA in FIG. 6. In one embodiment, a structure in which the second conductive layers 10b and 20b cover the ends of the first conductive layers 10a and 20a may be applicable to a region excluding the division region IA, for example, the inner pull-off area POA_i as in FIG. 7.

In one embodiment, a structure in which the second conductive layers 10b and 20b cover the ends of the first conductive layers 10a and 20a is applicable to an outer pull-off area POA_o. Although FIGS. 6 and 7 illustrate a structure in which the second conductive layers 10b and 20b cover the first conductive layers 10a and 20a not only in the division region IA but also in the inner and outer pull-off areas POA_i and POA_o, the same structure is applicable to other regions of the non-display area NDA, not the pull-off area POA.

When the second conductive layers 10b and 20b cover ends of the first conductive layers 10a and 20a, areas of the second conductive layers 10b and 20b contacting the first conductive layers 10a and 20a increase and thus may reduce resistance of the power voltage line. This may also prevent the first conductive layers 10a and 20a from being damaged while the second conductive layers 10b and 20b are patterned. For example, when the second conductive layers 10b and 20b are patterned such that the second conductive layers 10b and 20b are respectively located on only upper surfaces of the first conductive layers 10a and 20a, the first conductive layers 10a and 20a may be damaged by a gas used for etching (e.g. dry etching) of the second conductive layers 10b and 20b. When the second conductive layers 10b and 20b are patterned to cover the ends of the first conductive layers 10a and 20a, damage to the first conductive layers 10a and 20a may be prevented.

Referring to FIGS. 6 and 7, the first and second power voltage lines 10 and 20 may be covered by a protective layer PVX in the division region IA. The protective layer PVX covers the first and second power voltage lines 10 and 20 exposed via the division region IA. The protective layer PVX may include an inorganic insulating material including, for example, SiOx, SiNx, SiON, etc. The protective layer PVX may contact upper surfaces of the first and second power voltage lines 10 and 20 in the division region IA as in FIG. 6 and contact an upper surface of the second insulating layer 111.

If the protective layer PVX is absent, portions of the first and second power voltage lines 10 and 20 corresponding to the division region IA may be exposed to the outside until the thin film encapsulation layer 400 is formed. The exposed first and second power voltage lines 10 and 20 may be damaged by etchant used for patterning the pixel electrode 310 (e.g., see FIGS. 3A and 3B) of the display area DA. Particularly, when the first and second power voltage lines 10 and 20 include aluminum, the first and second power voltage lines 10 and 20 may be damaged by the etchant.

The etchant damages metal such as aluminum in the first and second conductive layers 10a, 20a, 10b, and 20b forming the first and second power voltage lines 10 and 20. To prevent damage by the etchant, the design may be partially changed, for example, so that the second conductive layers 10b and 20b, which are uppermost layers from among conductive layers of the first and second power voltage lines 10 and 20, overlap portions of the first conductive layers 10a and 20a. Also, an additional dam may be formed to extend in the first direction and to connect dams 121 to 123. However, the additional dam connecting dams 121 and 123 may provide a path via which external moisture penetrates. Furthermore, since areas of the second conductive layers 10b and 20b are reduced compared to areas of the first conductive layers 10a and 20a, there is limit in reducing resistance of a power voltage line to which a relatively high DC voltage is applied.

However, according to one or more embodiments, the protective layer PVX covers the first and second power voltage lines 10 and 20 exposed via the division region IA. Thus, the above-described damage by the etchant may be prevented and the design of the second conductive layers 10b and 20b does not need to be changed. Therefore, the damage of the power voltage line may be prevented while resistance of the power voltage line is reduced or minimized.

The first and second power voltage lines 10 and 20 are covered by the protective layer PVX in the division region IA and are not exposed to the outside. As described above, damage to the first and second power voltage lines 10 and 20 may be prevented during a process such as a process of forming the pixel electrode 310.

The protective layer PVX may be formed, for example, by chemical vapor deposition (CVD) after a portion of the second insulating layer 111 corresponding to the division region IA. The protective layer PVX may extend not only to the first and second power voltage lines 10 and 20 exposed via the division region IA, but also to an upper surface of the second insulating layer 111. For example, in FIG. 7, the protective layer PVX may cover the central portion 111a of the second insulating layer 111 and at least a portion of the upper surface of the outer portion 111b of the second insulating layer 111.

Portions of the first and second power voltage lines 10 and 20 corresponding to the division region IA may be covered by the thin film encapsulation layer 400, while overlapping the thin film encapsulation layer 400 via the division region IA. At least one of the dams 121 and 123 may prevent the organic encapsulation layer 430 of the thin film encapsulation layer 400 from flowing in an edge direction of the substrate 100. The first and second inorganic encapsulation layers 410 and 430 may extend to the outer pull-off area POA_o to cover the division region IA. The dams 121 and 123 may include the same material as that of the second insulating layer 111.

Figure 8:
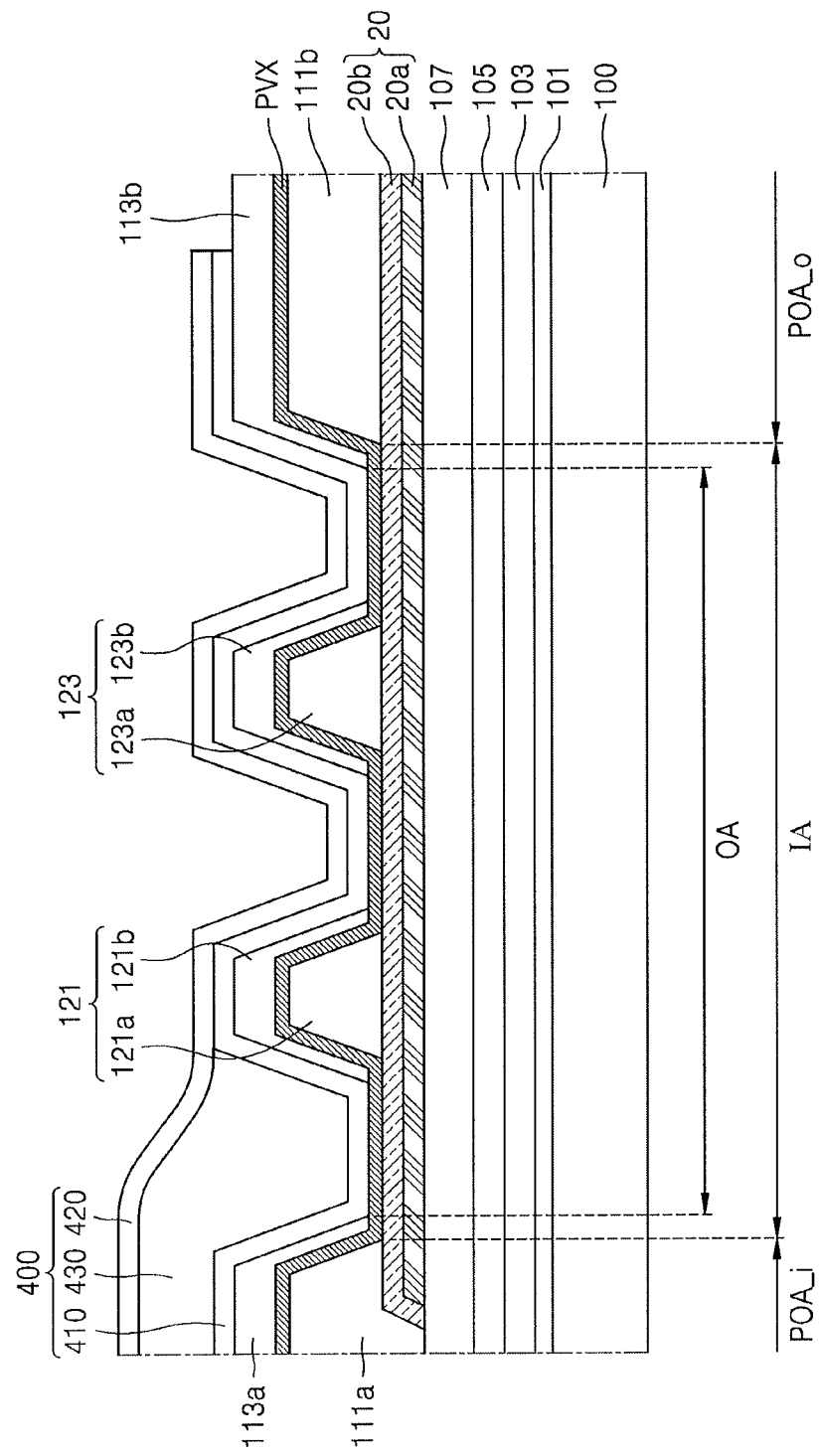
FIG. 8 illustrates a view of a modified embodiment of the view in FIG. 7.

FIG. 8 illustrates a cross-sectional view of an insert portion according to a modified embodiment of FIG. 7. Referring to FIG. 8, an additional insulating layer may be further arranged over the central portion 111a and the outer portion 111b of the second insulating layer 111.

For example, the pixel-defining layer 113 (e.g., see FIGS. 3A and 3B) of the display area DA may extend to the pull-off area POA. The pixel-defining layer 113 may include a first insulating portion 113a and a second insulating portion 113b. The first insulating portion 113a may correspond to the central portion 111a of the second insulating layer 111. The second insulating portion 113b may correspond to the outer portion 111b of the second insulating layer 111. The pixel-defining layer 113 may include a separation region OA corresponding to the division region IA of the second insulating layer 111. The first insulating portion 113a may be spaced apart from the second insulating portion 113b by the separation region OA. The separation region OA may have a size equal to or less than that of the division region IA.

The dam 121 may include first and second dam layers 121a and 121b respectively under and on the protective layer PVX, and the dam 123 may include first and second dam layers 123a and 123b respectively under and on the protective layer PVX. The first dam layers 121a and 123a may include the same material as the second insulating layer 111. The second dam layers 121b and 123b may include the same material as the pixel-defining layer 113 (e.g., see FIGS. 3A and 3B).

Figure 9:
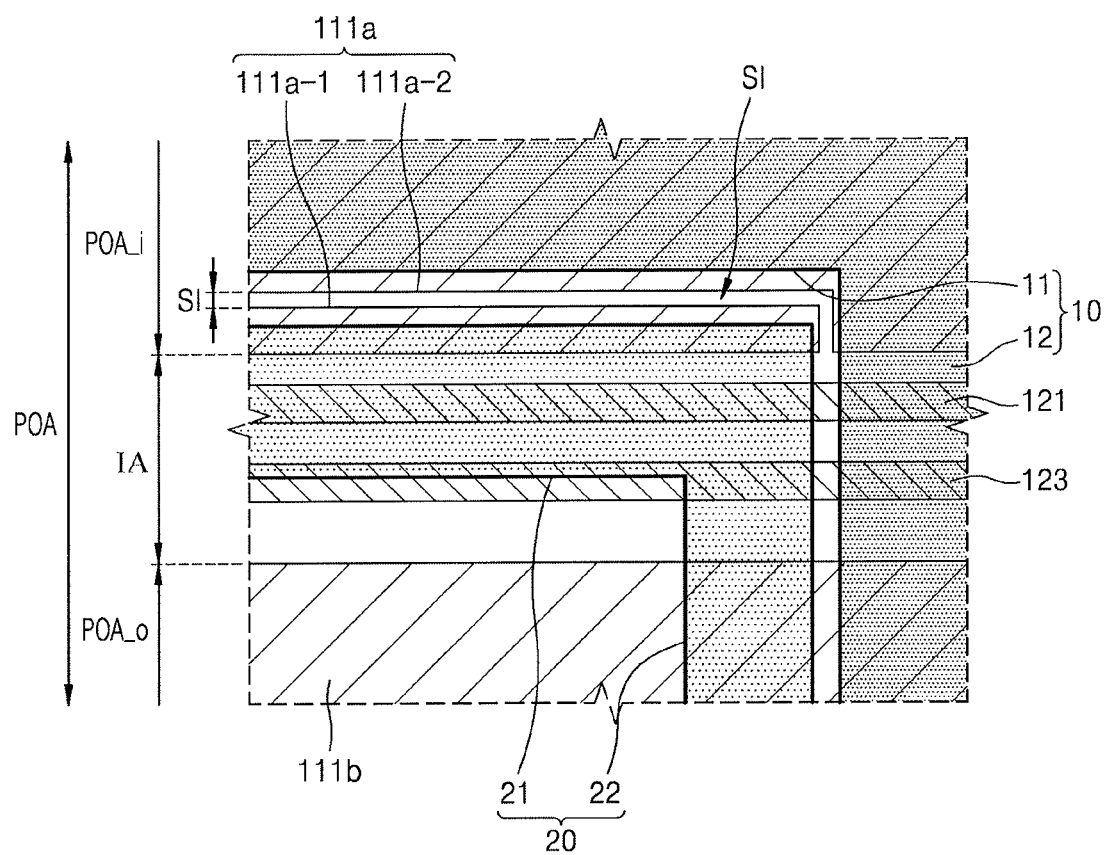
FIG. 9 illustrates a view of a modified embodiment of the view in FIG. 5.

FIG. 9 illustrates the insert portion according to a modified embodiment of FIG. 5. Referring to FIG. 9, the central portion 111a of the second insulating layer 111 may further include an auxiliary division region SI. For example, the central portion 111a may further include the auxiliary division region SI between a portion of the first power voltage line 10 and a portion of the second power voltage line 20. The central portion 111a may include a first central portion 111a-1 overlapping a portion of the first power voltage line 10 divided by the auxiliary division region SI, a portion of the second power voltage line 20, and a second central portion 111a-2. Like the division region IA, the auxiliary division region SI may prevent penetration of external moisture.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
a substrate including a display area and a non-display area adjacent to the display area;
a thin film transistor on the display area;
a display element electrically connected to the thin film transistor;
a thin film encapsulation layer covering the display element;
a power voltage line in the non-display area, the power voltage line including a first conductive layer and a second conductive layer disposed on and contacting the first conductive layer, wherein an end portion of the second conductive layer covers a lateral surface of a portion of the first conductive layer; and
a protective layer covering an upper surface of the power voltage line.

2. The display device of claim 1, wherein the protective layer includes an inorganic insulating material.

3. The display device of claim 1, wherein
the thin film transistor comprises a semiconductor layer, and a gate electrode overlapping the semiconductor layer, and
the display device further comprises an interlayer insulating layer on the gate electrode of the thin film transistor, and wherein the power voltage line is on the interlayer insulating layer.

4. The display device of claim 1, further comprising:
a lower driving voltage line and an upper driving voltage line in the display area and each electrically connected to the thin film transistor; and
an insulating layer between the lower driving voltage line and the upper driving voltage line, the insulating layer including a contact hole to connect the upper driving voltage line to the lower driving voltage line.

5. The display device of claim 4, wherein the insulating layer includes an organic insulating material.

6. The display device of claim 4, wherein
the first conductive layer includes a same material as the lower driving voltage line, and
the second conductive layer includes a same material as the upper driving voltage line.

7. The display device of claim 1, wherein
the thin film encapsulation layer includes at least one inorganic encapsulation layer and at least one organic encapsulation layer, and
a portion of the protective layer is covered with the thin film encapsulation layer.

8. The display device of claim 1, further comprising:
a dam surrounding the display area and overlapping a portion of the power voltage line.

9. The display device of claim 8, further comprising:
an organic insulating layer including a central portion in the display area and an outer portion in the non-display area, wherein
the central portion and the outer portion are spaced apart from each other with a division region therebetween, and
a portion of the dam is located in the division region and is apart from the central portion and the outer portion.

10. The display device of claim 9, wherein
the display element comprises a first electrode, a second electrode facing the first electrode, and an intermediate layer between the first electrode and the second electrode, and
the intermediate layer includes an emission layer.

11. The display device of claim 10, further comprising:
a pixel-defining layer including an opening exposing the pixel electrode, wherein
the dam includes the same material as the organic insulating layer or the pixel-defining layer.

12. The display device of claim 9, wherein
the power voltage line includes a first power voltage line and a second power voltage line that receive different voltages from each other, and
the central portion of the organic insulating layer includes an auxiliary division region between a portion of the first power voltage line and a portion of the second power voltage line and overlaps the portion of the first power voltage line and the portion of the second power voltage line.

13. A display device, comprising:
a substrate including a display area and a non-display area adjacent to the display area;
a thin film transistor on the display area;

a display element electrically connected to the thin film transistor;

a thin film encapsulation layer covering the display element;

a power voltage line in the non-display area, the power voltage line including a first conductive layer and a second conductive layer disposed on and contacting the first conductive layer;

an insulating layer covering a portion of the second conductive layer of the power voltage line; and a protective layer on the insulating layer and covering an upper surface of at least a part of the power voltage line.

14. The display device of claim 13, wherein the insulating layer includes an organic insulating material, and the protective layer includes an inorganic insulating material.

15. The display device of claim 13, wherein an end portion of the second conductive layer of the power voltage line covers a lateral surface of a portion of the first conductive layer.

16. The display device of claim 13, wherein the thin film transistor comprises a semiconductor layer and a gate electrode overlapping the semiconductor layer, and the display device further comprises an interlayer insulating layer on the gate electrode of the thin film transistor, and wherein the power voltage line is on the interlayer insulating layer.

17. The display device of claim 13, further comprising:

a lower driving voltage line and an upper driving voltage line in the display area and electrically connected to the thin film transistor; and a first insulating layer between the lower driving voltage line and the upper driving voltage line, the first insulating layer including a contact hole to connect the lower driving voltage line and the upper driving voltage line.

18. The display device of claim 13, wherein the thin film encapsulation layer includes at least one inorganic encapsulation layer and at least one organic encapsulation layer, and a portion of the protective layer is covered with the thin film encapsulation layer.

19. The display device of claim 13, further comprising:

a dam surrounding the display area and overlapping a portion of the power voltage line.

20. The display device of claim 19, wherein the insulating layer includes an inner portion and an outer portion being spaced apart from each other with a division region therebetween, and at least a portion of the dam is located in the division region and is apart from the central portion and the outer portion.

21. The display device of claim 19, wherein the display element comprises:

a first electrode;

a pixel-defining layer includes an opening overlapping the pixel electrode;

a second electrode facing the first electrode; and an intermediate layer between the first electrode and the second electrode and including an emission layer, and the dam includes the same material as at least one of the insulating layer or the pixel-defining layer.

22. The display device of claim 20, wherein the power voltage line includes a first power voltage line and a second power voltage line that receive different voltages from each other, and the inner portion of the insulating layer includes an auxiliary division region between a portion of the first power voltage line and a portion of the second power voltage line and overlaps the portion of the first power voltage line and the portion of the second power voltage line.

* * * * *